(12) United States Patent
Yamaguchi et al.

(10) Patent No.: US 9,315,416 B2
(45) Date of Patent: Apr. 19, 2016

(54) METHOD OF MANUFACTURING LIGHT-EMITTING DEVICE

(75) Inventors: Seiji Yamaguchi, Kiyosu (JP); Koji Tasumi, Kiyosu (JP); Hiroyuki Tajima, Kiyosu (JP); Satoshi Wada, Kiyosu (JP); Miki Moriyama, Kiyosu (JP); Kazuya Aida, Urawa (JP); Hiroki Watanabe, Urawa (JP)

(73) Assignees: TOYODA GOSEI CO., LTD., Kiyosu-shi, Aichi-ken (JP); SUMITA OPTICAL GLASS, INC., Saitama-shi, Saitama (JP)

(*) Notice: Subject to any disclaimer, the term of this patent is extended or adjusted under 35 U.S.C. 154(b) by 614 days.

(21) Appl. No.: 13/137,150

(22) Filed: Jul. 22, 2011

(65) Prior Publication Data

US 2012/0067085 A1    Mar. 22, 2012

(30) Foreign Application Priority Data

Sep. 16, 2010 (JP) .................................. 2010-208147

(51) Int. Cl.
C03C 27/00 (2006.01)
H01L 33/56 (2010.01)

(52) U.S. Cl.
CPC ................ *C03C 27/00* (2013.01); *H01L 33/56* (2013.01); *H01L 2224/13* (2013.01); *H01L 2933/005* (2013.01)

(58) Field of Classification Search
CPC ... C03C 27/00; H01L 33/56; H01L 2933/005; H01L 2224/13
USPC ............ 65/102, 39, 45, 47, 48, 305, 32.2, 36, 65/59.1
See application file for complete search history.

(56) References Cited

U.S. PATENT DOCUMENTS

| | | | |
|---|---|---|---|
| 1,889,881 A * | 12/1932 | Thompson | 65/305 |
| 7,833,073 B2 | 11/2010 | Ogawa | |
| 2005/0161771 A1* | 7/2005 | Suehiro et al. | 257/612 |
| 2006/0162384 A1* | 7/2006 | Yamanaka | 65/102 |
| 2006/0162385 A1* | 7/2006 | Yamanaka et al. | 65/102 |
| 2006/0261364 A1 | 11/2006 | Suehiro et al. | |
| 2009/0186433 A1* | 7/2009 | Yamaguchi et al. | 438/26 |

(Continued)

FOREIGN PATENT DOCUMENTS

| | | |
|---|---|---|
| JP | 2006-156668 A | 6/2006 |
| JP | 2008-34546 A | 2/2008 |

(Continued)

OTHER PUBLICATIONS

Japanese Office Action dated Jul. 23, 2013, with partial English translation.

(Continued)

*Primary Examiner* — Michael H Wilson
*Assistant Examiner* — Yana B Krinker
(74) *Attorney, Agent, or Firm* — McGinn IP Law Group PLLC

(57) ABSTRACT

A method of manufacturing a light-emitting device including a light-emitting element mounted on a substrate and sealed with a glass. The method includes heating the glass by a first mold that is heated to a temperature higher than a yield point of the glass, the glass contacting the first mold, and pressing the glass against the light-emitting element mounted on the substrate supported by a second mold to seal the light-emitting element with the glass.

11 Claims, 6 Drawing Sheets

(56) References Cited

U.S. PATENT DOCUMENTS

| | | |
|---|---|---|
| 2010/0203658 A1 | 8/2010 | Aida et al. |
| 2011/0057553 A1 | 3/2011 | Ogawa |
| 2011/0101399 A1 | 5/2011 | Suehiro et al. |
| 2012/0171789 A1 | 7/2012 | Suehiro et al. |

FOREIGN PATENT DOCUMENTS

| | | |
|---|---|---|
| JP | 2008-085361 A | 4/2008 |
| JP | 2009-177131 | 8/2009 |
| JP | 2010-186887 A | 8/2010 |

OTHER PUBLICATIONS

Japanese Office Action dated Nov. 12, 2013, with partial English translation.

Japanese Office Action dated Mar. 25, 2014 with a partial English Translation.

* cited by examiner

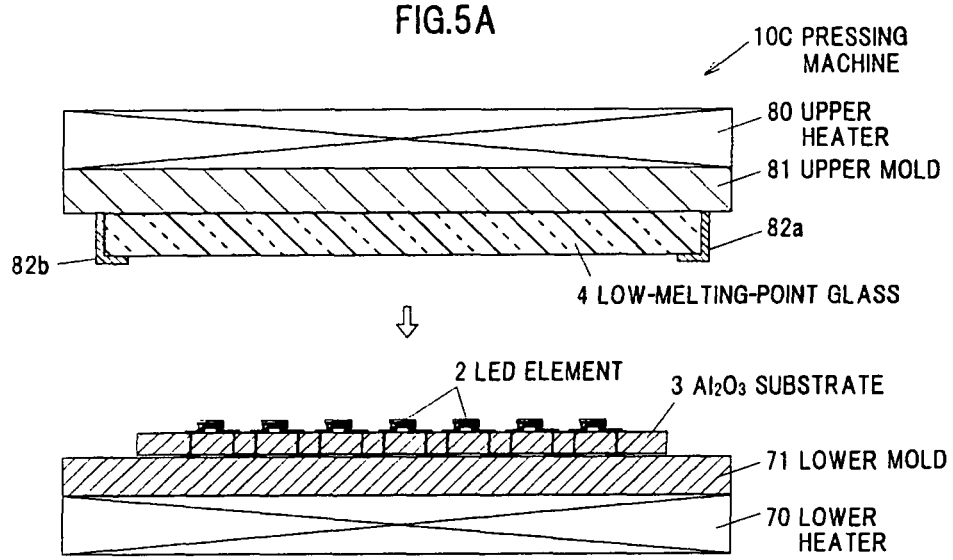
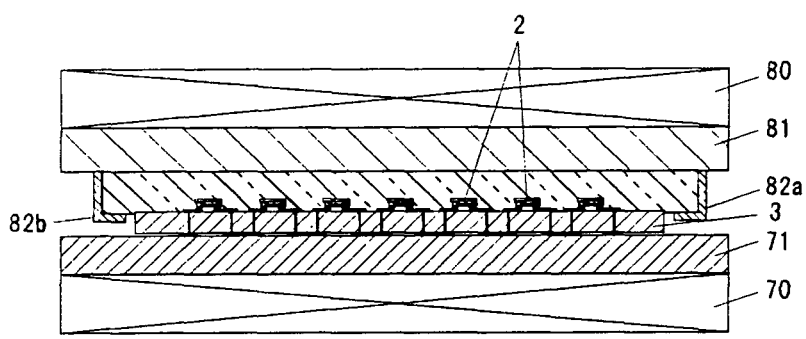

METHOD OF MANUFACTURING LIGHT-EMITTING DEVICE

The present application is based on Japanese Patent Application No. 2010-208147 filed on Sep. 16, 2010, the entire contents of which are incorporated herein by reference.

BACKGROUND OF THE INVENTION

1. Field of the Invention

The invention relates to a method of manufacturing a light-emitting device having a light-emitting element on a mounting substrate sealed with glass by using a mold.

2. Related Art

JP-A-2009-177131 discloses a light-emitting device that a light-emitting element on a wiring board is sealed with glass. The light-emitting device disclosed in JP-A-2009-177131 are manufactured such that plural light-emitting elements are mounted on a wiring board, the light-emitting elements are collectively sealed with a glass by hot-pressing the plate-shaped low-melting-point glass, and they are subsequently singulated by dicing.

SUMMARY OF THE INVENTION

In manufacturing the light-emitting device, as shown in FIG. 6A, a pressing machine provided with an upper mold 121 heated by an upper heater 120 and a lower mold 111 heated by a lower heater 110 is used. A substrate 100 having plural LED elements 101 mounted thereon is placed on the lower mold 111. Further, a low-melting-point glass 102 is placed on the substrate 100 and on the LED elements 101 so as to transfer heat of the lower heater 110 to the low-melting-point glass 102 through the lower mold 111, the substrate 100 and the plural LED elements 101. After the low-melting-point glass 102 reaches a yield point or higher, the upper mold 121 heated to a predetermined temperature which is lower than the temperature of the lower mold 111 is moved down to the lower mold 111 so as to perform the hot pressing.

By the hot pressing, the low-melting-point glass 102 is fusion-bonded to the substrate 100 at the positions between the plural LED elements 101 as shown in FIG. 6B, and the LED elements 101 are thereby sealed with the glass.

Since the low-melting-point glass 102 is heated via the LED element 101 in the manufacturing method, it is necessary to heat the LED element 101 to a temperature higher than the low-melting-point glass 102 to transfer the heat to the low-melting-point glass 102. Therefore, some of the LED elements 101 mounted on the substrate 100 may be thermally-damaged such that they lower in light intensity or increase in forward voltage.

Accordingly, it is an object of the invention to provide a method of manufacturing a light-emitting device that can prevent thermal damage to the light-emitting element during the hot-pressing.

(1) According to one embodiment of the invention, a method of manufacturing a light-emitting device comprising a light-emitting element mounted on a substrate and sealed with a glass, the method comprises:

heating the glass by a first mold that is heated to a temperature higher than a yield point of the glass, the glass contacting the first mold; and pressing the glass against the light-emitting element mounted on the substrate supported by a second mold while heating the glass to the temperature higher than the yield point of the glass to seal the light-emitting element with the glass.

In the above embodiment (1) of the invention, the following modifications and changes can be made.

(i) A temperature of the second mold in the pressing of the glass is lower than a temperature of the first mold.

(ii) The first mold is disposed under the second mold.

(iii) The first mold comprises a protrusion formed on a surface thereof for restricting the pressed glass from flowing out.

(iv) The glass is plate-shaped, and the protrusion is, in a bottom view of the first mold, shaped like a rectangular frame having a width about equal to that of the plate-shaped glass.

(v) Before pressing the glass, the glass is disposed on a top surface of the protrusion.

(vi) The protrusion comprises an air vent for venting the air outside the rectangular frame.

Points of the Invention

According to one embodiment of the invention, a method of manufacturing a light-emitting device is conducted such that a low-melting-point glass contacts an $Al_2O_3$ substrate and an LED element after the glass is heated to a yield point or higher by a lower mold with a built-in heater and is then hot-pressed. Thus, the $Al_2O_3$ substrate and the LED element are not heated to the yield point or higher before the hot-pressing, so that the thermal load of the LED element can be reduced.

BRIEF DESCRIPTION OF THE DRAWINGS

Next, the present invention will be explained in more detail in conjunction with appended drawings, wherein:

FIGS. 2A and 2B are schematic views showing a pressing machine for performing a hot pressing step and a low-melting-point glass 4, etc., placed thereon in the first embodiment of the invention, wherein FIG. 2A shows a state before the hot pressing step and FIG. 2B shows a state during the hot pressing step;

FIGS. 3A and 3B are schematic views showing a pressing machine for performing a hot pressing step and a low-melting-point glass 4, etc., placed thereon in a second embodiment of the invention, wherein FIG. 3A shows a state before the hot pressing step and FIG. 3B shows a state during the hot pressing step;

FIGS. 4A and 4B are schematic views showing a pressing machine for performing a hot pressing step and a low-melting-point glass 4, etc., placed thereon in a third embodiment of the invention, wherein FIG. 4A shows a state before the hot pressing step and FIG. 4B shows a state during the hot pressing step;

FIGS. 5A and 5B are schematic views showing a pressing machine for performing a hot pressing step and a low-melting-point glass 4, etc., placed thereon in a fourth embodiment of the invention, wherein FIG. 5A shows a state before the hot pressing step and FIG. 5B shows a state during the hot pressing step.

DESCRIPTION OF THE PREFERRED EMBODIMENTS

First Embodiment

Structure of Light-Emitting Device 1

Figure 1:
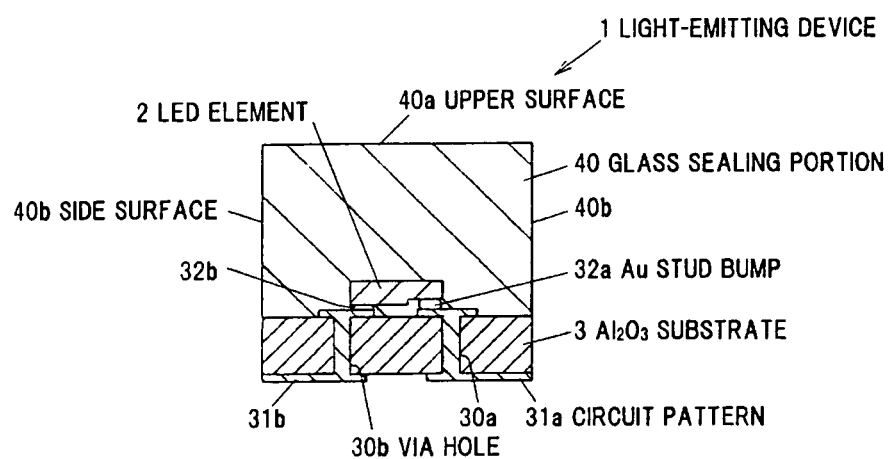
FIG. 1 is a cross sectional view showing a light-emitting device in a first embodiment of the present invention.

FIG. 1 is a vertical cross sectional view showing a light-emitting device in a first embodiment of the invention.

A light-emitting device 1 has a flip-chip-type LED (Light Emitting Diode) element 2 as a light-emitting element formed of a GaN-based semiconductor material, an $Al_2O_3$ substrate 3 for mounting the LED element 1 circuit patterns 31a and 31b formed of tungsten (W)-nickel (Ni)-gold (Au) and formed in the $Al_2O_3$ substrate 3. Au stud bumps 32a and 32b for electrically connecting the LED element 2 to the circuit patterns 31a and 31b, and a glass sealing portion 40 which seals the LED element 2 and is fusion-bonded to the $Al_2O_3$ substrate 3.

The $Al_2O_3$ substrate 3 has via holes 30a and 30b for inserting through the circuit patterns 31a and 31b which are metallized on front and rear surfaces of the substrate and are formed of W—Ni—Au.

The glass sealing portion 40 is formed of low-melting-point glass, is cut by a dicer after fusion-bonding to the $Al_2O_3$ substrate 3 by a hot pressing step using a mold, and is thereby formed in a rectangular shape which has an upper surface 40a and a side surface 40b.

The light-emitting device 1 configured as described above emits light of the LED element 2 from the upper surface 40a and the side surface 40b of the glass sealing portion 40 by conducting electricity to the LED element 2 via the circuit patterns 31a, 31b and the Au stud bumps 32a, 32b.

Method of Manufacturing the Light-Emitting Device 1

A method of manufacturing the light-emitting device 1 will be described below in reference to FIGS. 2A and 2B. The method of manufacturing the light-emitting device 1 includes a mounting step in which the LED element 2 is mounted on the $Al_2O_3$ substrate 3, an arranging step in which the $Al_2O_3$ substrate 3 having the LED element 2 mounted thereon and the low-melting-point glass 4 constituting the glass sealing portion 40 are arranged in a pressing machine 10, a heating step for heating the $Al_2O_3$ substrate 3, the LED element 2 and the low-melting-point glass 4, a hot pressing step for hot pressing the $Al_2O_3$ substrate 3 having the LED element 2 mounted thereon and the low-melting-point glass 4 by applying pressure, a taking-out step for taking out the hot-pressed $Al_2O_3$ substrate 3, etc., and a dicing step for singulating the LED elements 2 by dicing to complete the light-emitting device 1. Each of the steps will be described in detail below.

Mounting Step

Firstly, the $Al_2O_3$ substrate 3 having the via holes 30a and 30b formed therein is prepared, and a tungsten paste is screen-printed on the front and rear surfaces of the $Al_2O_3$ substrate 3 according to the shape of the circuit patterns 31a and 31b. The $Al_2O_3$ substrate 3 has a size which allows mounting of plural LED elements 2 (e.g., 22.5 mm square), and the via holes 30a and 30b are formed for each LED element 2.

Next, the $Al_2O_3$ substrate 3, on which the tungsten paste is printed, is heat-treated at a temperature above 1000° C. to bake tungsten on the substrate 3, and Ni plating and Au plating are then applied on the tungsten, thereby forming the circuit patterns 31a and 31b. Then, plural LED elements 2 are mounted on the $Al_2O_3$ substrate 3 on the element mounting surface side (on the front side), and respective electrodes of the LED element 2 are electrically connected to the circuit patterns 31a and 31b by the Au stud bumps 32a and 32b.

Arranging Step

Figure 2A:
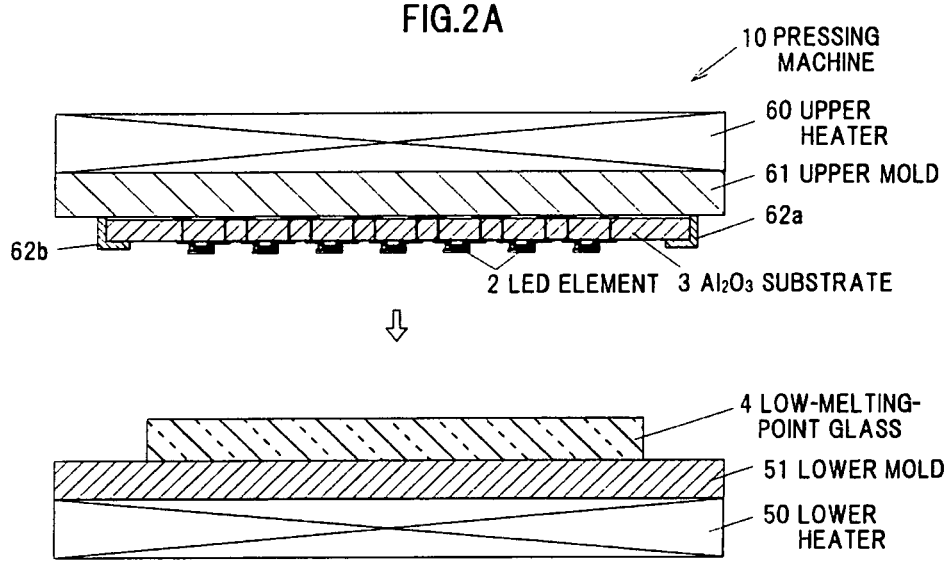
Figure 2B:
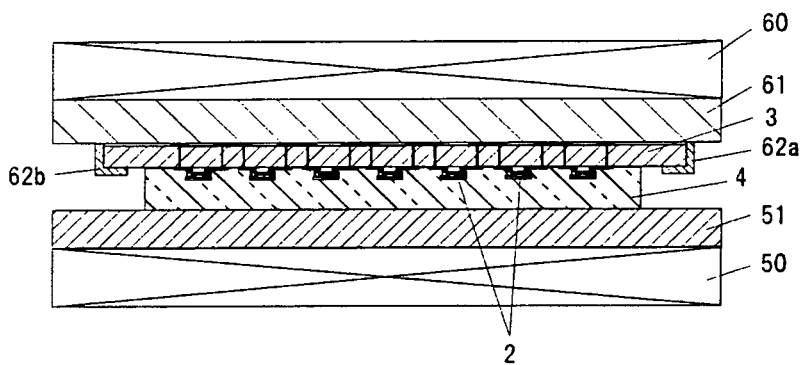

FIGS. 2A and 2B are schematic views showing a pressing machine 10 for performing a hot pressing step and an $Al_2O_3$ substrate 3, etc., placed thereon, wherein FIG. 2A shows a state before the hot pressing step and FIG. 2B shows a state during the hot pressing step.

As shown in FIG. 2A, the pressing machine 10 has a lower heater 50, a lower mold 51 as a first mold which is heated by the lower heater 50, an upper mold 61 as a second mold which is arranged to face the lower mold 51 and is relatively movable in a direction perpendicular to the lower mold 51, and an upper heater 60 for heating the upper mold 61.

A locking portion 62 (a first locking claw 62a and a second locking claw 62b) for holding the $Al_2O_3$ substrate 3 having the plural LED elements 2 mounted thereon is provided to the upper mold 61. The locking portion 62 has the first locking claw 62a and the second locking claw 62b which extend along two opposite sides of the $Al_2O_3$ substrate 3 in a direction orthogonal to a paper face of the drawing so as to hold the edges of the two sides.

In the arranging step, a plate-shaped low-melting-point glass 4 to be the glass sealing portion 40 of the light-emitting device 1 is placed on the lower mold 51 so as to be in contact with the lower mold 51. Meanwhile, the $Al_2O_3$ substrate 3 having the plural LED elements 2 mounted thereon is arranged under the upper mold 61 so as to be held by the locking portion 62.

Heating Step

In the heating step, electricity is conducted to the lower heater 50 and the upper heater 60 to heat the lower mold 51 and the upper mold 61. The upper heater 60 and the lower heater 50 can heat the upper mold 61 and the lower mold 51 by, e.g., Joule heat generated by conducting electricity to a heating wire, or by infrared radiation.

The lower mold 51 receives heat from the lower heater 50 and then heats the low-melting-point glass 4 to a yield point temperature thereof or higher. The low-melting-point glass 4 has a yield point temperature of e.g., 600° C. or less and is likely to deform if pressure is applied at a temperature of 600° C. or more.

Meanwhile, the upper mold 61 receives heat from the upper heater 60 and then heats the plural LED elements 2 and the $Al_2O_3$ substrate 3 to a temperature lower than that of the low-melting-point glass 4 which is heated by the lower mold 51. That is, the temperature of the upper mold 61 at the time of completion of the heating step is lower than that of the lower mold 51, and the temperature of the LED elements 2 and the $Al_2O_3$ substrate 3 which are heated by the upper mold 61 is lower than the yield point temperature of the low-melting-point glass 4.

Hot Pressing Step

In the hop pressing step, the low-melting-point glass 4 is brought close to the $Al_2O_3$ substrate 3 by relatively moving the upper mold 61 toward the lower mold 51 by using a pressure device of which illustration is omitted, and then the low-melting-point glass 4 and the $Al_2O_3$ substrate 3 are pressed from above and below at a predetermined pressure (e.g., 60 kgf) to perform the hot pressing step.

By performing the hot pressing step, the low-melting-point glass 4 is fusion-bonded to the element mounting surface of the $Al_2O_3$ substrate 3 in a region where the LED elements 2 are not mounted, and each of the plural LED elements 2 is sealed with the low-melting-point glass 4.

Taking-Out Step

After completing the hot pressing step, the upper mold 61 is separated from the lower mold 51, and the $Al_2O_3$ substrate 3 having the glass-sealed plural LED elements 2 mounted thereon is taken out from the pressing machine 10. Since the low-melting-point glass 4 is fusion-bonded to the $Al_2O_3$ substrate 3 at this stage, the low-melting-point glass 4 is separated together with the $Al_2O_3$ substrate 3 from the lower mold 51.

Dicing Step

In the dicing step, the $Al_2O_3$ substrate 3 taken out from the pressing machine 10 is cut together with the low-melting-point glass 4 by dicing at the positions between the plural LED elements 2 and is singulated to form plural light-emitting devices 1. The dicing is performed by placing the Al$_2$O$_3$ substrate 3 on a dicer and then cutting between the plural LED elements 2 using a dicing blade. The LED element 2, the Al$_2$O$_3$ substrate 3, the circuit patterns 31a, 31b and the low-melting-point glass 4 (the glass sealing portion 40), which are each singulated, constitute the light-emitting device 1.

Effects of the First Embodiment

The following effects are obtained by the above described first embodiment.

(1) Since it is not necessary to conduct heat to the low-melting-point glass 4 via the Al$_2$O$_3$ substrate 3 and the LED element 2 in order to heat the low-melting-point glass 4 to the yield point temperature thereof or higher, it is possible to suppress thermal damage to the LED element 2. That is, since the low-melting-point glass 4 contacts with the Al$_2$O$_3$ substrate 3 and the LED element 2 after being heated to the yield point temperature or higher by the lower mold 51 and is then hot-pressed, it is not necessary to heat the Al$_2$O$_3$ substrate 3 and the LED element 2 to the yield point temperature or higher and the thermal load of the LED element 2 is thus reduced. The LED element 2 may be temporarily heated to the yield point temperature or higher during the hot pressing step since the Al$_2$O$_3$ substrate 3 and the LED element 2 contact with the heated low-melting-point glass 4, however, the thermal damage to the LED element 2 is suppressed since the hot-pressing time is shorter than the case where the low-melting-point glass 4 is heated via the Al$_2$O$_3$ substrate 3 and the LED element 2.

(2) Since, in the heating step, the low-melting-point glass 4 is heated by thermal conduction from the lower mold 51 of which thermal conductivity is higher than those of the Al$_2$O$_3$ substrate 3 and the LED element 2, it is possible to heat the low-melting-point glass 4 to the yield point temperature or higher in a shorter time than the case where the low-melting-point glass 4 is heated via the Al$_2$O$_3$ substrate 3 and the LED element 2 and it is thereby possible to shorten the time required for the heating step.

Second Embodiment

Next, the second embodiment of the invention will be described in reference to FIGS. 3A and 3B.

Figure 3A:
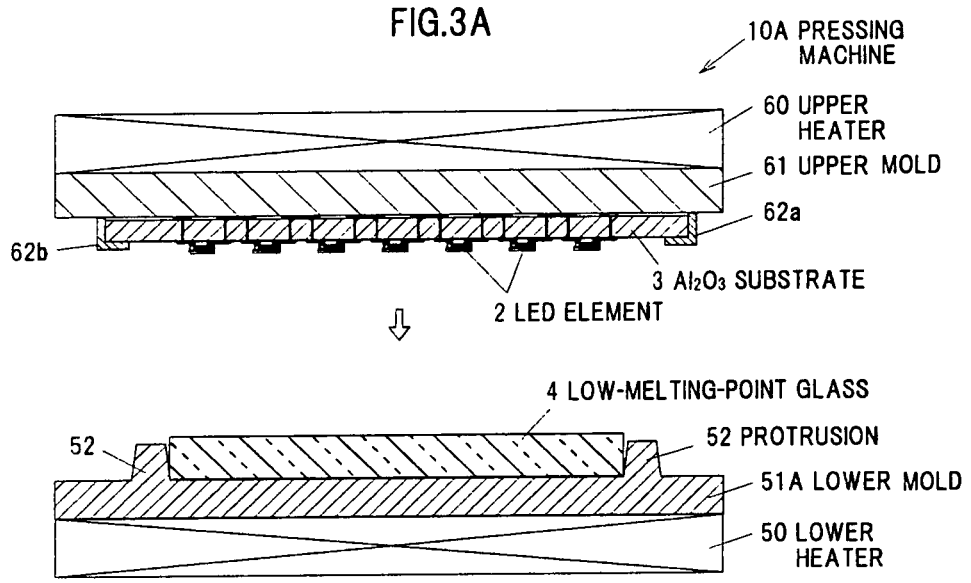
Figure 3B:
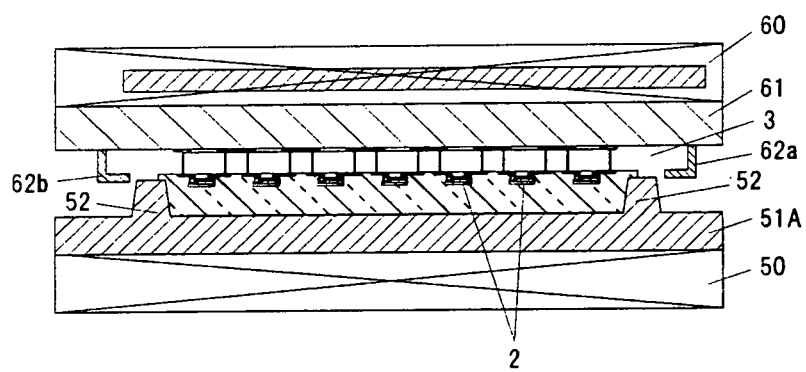

FIGS. 3A and 3B are schematic views showing a hot pressing step in a manufacturing method of the present embodiment, wherein FIG. 3A shows a state before the hot pressing step and FIG. 3B shows a state during the hot pressing step. In the drawing, elements having the same structure and function as those in the first embodiment are denoted by the same reference numerals and the explanations thereof will be omitted.

In the present embodiment, the low-melting-point glass 4 is heated to the yield point temperature thereof or higher and the Al$_2$O$_3$ substrate 3 and the LED element 2 are heated to a temperature lower than the low-melting-point glass 4 to perform the hot pressing step in the same manner as the first embodiment, but a shape of a lower mold 51A which conducts heat of the lower heater 50 to the low-melting-point glass 4 is different from the first embodiment.

As shown in FIG. 3A, a protrusion 52 formed to protrude toward the upper mold 61 is integrally provided on the lower mold 51A of a pressing machine 10A in the present embodiment. The protrusion 52 is formed in a square shape so as to surround a region of the Al$_2$O$_3$ substrate 3 in which the plural LED elements 2 are mounted.

The low-melting-point glass 4 is placed on the lower mold 51A so that the surface thereof is in contact with the lower mold 51A within the region surrounded by the protrusion 52, and is heated to the yield point temperature or higher by the lower mold 51A which receives heat of the lower heater 50.

Then, when the low-melting-point glass 4 is hot-pressed to the Al$_2$O$_3$ substrate 3 having the plural LED elements 2 mounted thereon, the protrusion 52 restricts horizontal flow of the low-melting-point glass 4, as shown in FIG. 3B.

Effects of the Second Embodiment

The second embodiment also achieves the same effect as the above-mentioned (1) and (2) of the first embodiment. In addition, since the horizontal flow of the low-melting-point glass 4 caused by the pressure during the hot pressing step is restricted by the protrusion 52, it is possible to equalize the pressure of the low-melting-point glass 4 in the region of the Al$_2$O$_3$ substrate 3 in which the plural LED elements 2 are mounted and it is thus possible to carry out more adequate glass sealing.

Third Embodiment

Next, the third embodiment of the invention will be described in reference to FIGS. 4A and 4B.

Figure 4A:
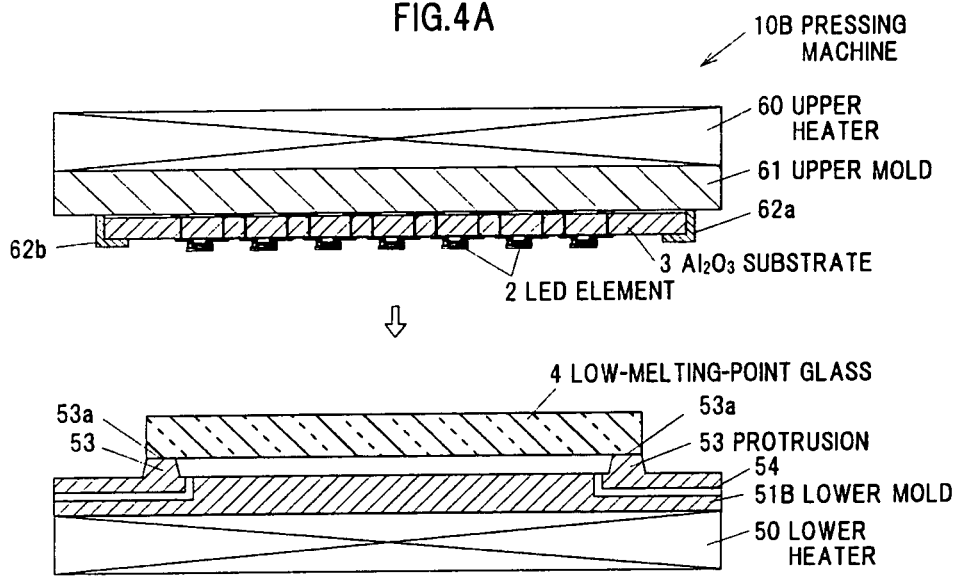
Figure 4B:
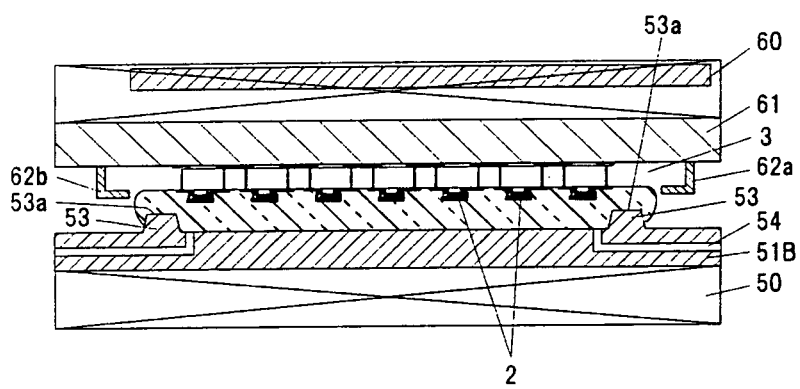
Figure 6A:
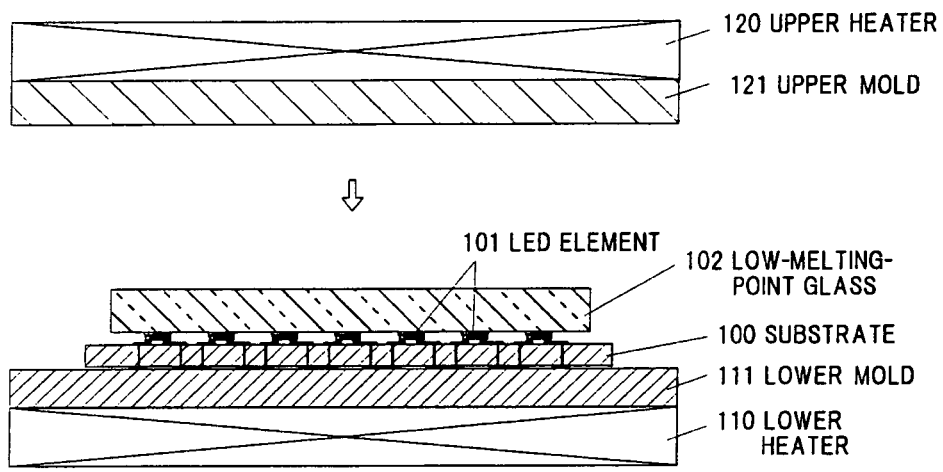
FIGS. 6A and 6B are schematic views showing a conventional method of manufacturing a light-emitting device.
Figure 6B:
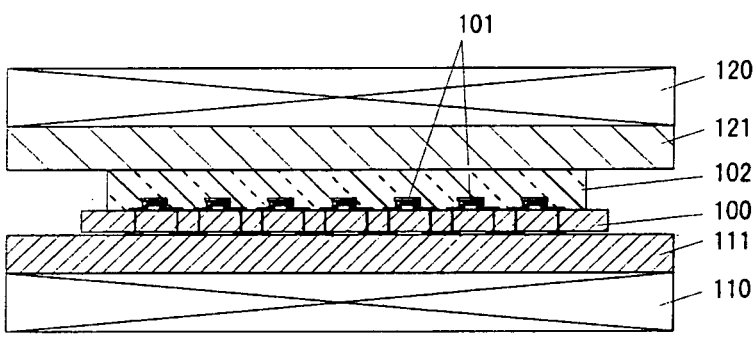

FIGS. 4A and 4B are schematic views showing a hot pressing step in a manufacturing method of the present embodiment, wherein FIG. 4A shows a state before the hot pressing step and FIG. 4B shows a state during the hot pressing step. In the drawing, elements having the same structure and function as those in the first embodiment are denoted by the same reference numerals and the explanations thereof will be omitted.

In the present embodiment, the low-melting-point glass 4 is heated to the yield point temperature thereof or higher and the Al$_2$O$_3$ substrate 3 and the LED element 2 are heated to a temperature lower than the low-melting-point glass 4 to perform the hot pressing step in the same manner as the first embodiment, but a shape of a lower mold 51B which conducts heat of the lower heater 50 to the low-melting-point glass 4 is different from the first and second embodiments.

As shown in FIG. 4A, a protrusion 53 formed to protrude toward the upper mold 61 is integrally provided on the lower mold 5IB of a pressing machine 10B in the present embodiment. The protrusion 53 is formed in a square shape so as to surround a region of the Al$_2$O$_3$ substrate 3 in which the plural LED elements 2 are mounted.

The low-melting-point glass 4 is placed on the lower mold 51B so that the surface thereof is in contact with an upper surface 53a of the protrusion 53, and is heated to the yield point temperature or higher by the lower mold 51B which receives heat of the lower heater 50. Here, an air vent 54 for flowing out the air in a region surrounded by the protrusion 53 and the low-melting-point glass 4 is formed in the lower mold 51B.

Then, when the low-melting-point glass 4 is hot-pressed to the Al$_2$O$_3$ substrate 3 having the plural LED elements 2 mounted thereon, the protrusion 53 is embedded into an edge of the low-melting-point glass 4 and the horizontal flow of the low-melting-point glass 4 is thus restricted, as shown in FIG. 4B.

Effect of the Third Embodiment

The third embodiment also achieves the same effect as the above-mentioned (1) and (2) of the first embodiment. In addition, since the protrusion 53 is embedded into the edge of the low-melting-point glass 4 and restricts the horizontal flow of the low-melting-point glass 4 at the time of hot-pressing, it is possible to equalize the pressure of the low-melting-point glass 4 in the region of the $Al_2O_3$ substrate 3 in which the plural LED elements 2 are mounted and it is thus possible to carry out more adequate glass sealing.

Fourth Embodiment

Next, the fourth embodiment of the invention will be described in reference to FIGS. 5A and 5B.

FIGS. 5A and 5B are schematic views showing a hot pressing step in a manufacturing method of the present embodiment, wherein FIG. 5A shows a state before the hot pressing step and FIG. 5B shows a state during the hot pressing step. In the drawing, elements having the same structure and function as those in the first embodiment are denoted by the same reference numerals and the explanations thereof will be omitted.

In the present embodiment, the low-melting-point glass 4 is heated to the yield point temperature thereof or higher and the $Al_2O_3$ substrate 3 and the LED element 2 are heated to a temperature lower than the low-melting-point glass 4 to perform the hot pressing step in the same manner as the first embodiment, but the present embodiment is different from the first embodiment in that the low-melting-point glass 4 is heated by an upper mold 81 and the $Al_2O_3$ substrate 3 having the plural LED elements 2 mounted thereon is heated by a lower mold 71.

As shown in FIG. 5A, a pressing machine 10C in the present embodiment has a lower heater 70, a lower mold 71 as a second mold which is heated by the lower heater 70, an upper mold 81 as a first mold which is arranged to face the lower mold 71 and is relatively movable in a direction perpendicular to the lower mold 71, and an upper heater 80 for heating the upper mold 81.

A locking portion 82 (a first locking claw 82a and a second locking claw 82b) for holding the plate-shaped low-melting-point glass 4 is provided to the upper mold 81. The locking portion 82 has the first locking claw 82a and the second locking claw 82b which extend along two opposite sides of the low-melting-point glass 4 in a direction orthogonal to a paper face of the drawing so as to hold the edges of the two sides.

In the arranging step, the $Al_2O_3$ substrate 3 having the plural LED elements 2 mounted thereon is placed on the lower mold 71 so as to be in contact with the lower mold 71. Meanwhile, the low-melting-point glass 4 is arranged under the upper mold 81 so as to be held by the locking portion 82.

In the heating step, the upper mold 81 heats the low-melting-point glass 4 to the yield point temperature thereof or higher by heat from the upper heater 80. Meanwhile, by heat from the lower heater 70, the lower mold 71 heats the $Al_2O_3$ substrate 3 and the LED element 2 to a temperature lower than the low-melting-point glass 4 which is heated by the upper mold 81.

In the hop pressing step, the upper mold 81 moves toward the lower mold 71 and presses the low-melting-point glass 4 held by the upper mold 81 against the $Al_2O_3$ substrate 3 and the LED element 2, thereby sealing the LED element 2 with the glass.

After completing the hot pressing step, the upper mold 81 is separated from the lower mold 71, the $Al_2O_3$ substrate 3 having the glass-sealed plural LED elements 2 mounted thereon is taken out from the pressing machine 10C, the LED elements 2 are singulated into each piece by dicing, thereby obtaining plural light-emitting devices 1.

Effects of the Fourth Embodiment

The fourth embodiment also achieves the same effect as the above-mentioned (1) and (2) of the first embodiment. In addition, since the low-melting-point glass 4 is located on the $Al_2O_3$ substrate 3 and the LED element 2 after the hot pressing step, the low-melting-point glass 4 is stably fusion-bonded to the $Al_2O_3$ substrate 3 and the LED element 2 by its own weight.

Other Embodiments

Although the method of manufacturing a light-emitting device according to the present invention has been described based on each of the above-mentioned embodiments, the invention is not intended to be limited to these embodiments and it is possible to implement in various features without going beyond a scope of the concept.

Although the hot pressing step is performed by, e.g., moving the upper mold toward the lower mold in each of the above-mentioned embodiments, it is not limited thereto and the hot pressing step may be performed by moving, the lower mold toward the upper mold. Alternatively, each mold may be moved so that the upper and lower molds approach each other.

In addition, although the light-emitting device 1 is configured so that one light-emitting device 1 includes one LED element 2 in each of the above-mentioned embodiments, one light-emitting device may include plural LED elements 2.

In addition, in each of the above-mentioned embodiments, although heaters (the upper heater 60 and the lower heater 70) are provided to molds (the upper mold 61 and the lower mold 71) on a side where the $Al_2O_3$ substrate 3 is arranged, it is not necessary to provide a heater to a mold on a side where the $Al_2O_3$ substrate 3 is arranged as long as the LED element 2 is not thermally damaged by a thermal shock at the time of hot pressing step.

Still further, although a LED element is mounted on an $Al_2O_3$ substrate in each of the above-mentioned embodiments, it can be replaced with other ceramic substrates such as AlN substrate or metal substrates of W—Cu, etc.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:
1. A method of manufacturing a light-emitting device comprising a light-emitting element mounted on a substrate and sealed with a glass, the method comprising:
heating the glass by a thermal conduction from a first mold that is heated to a temperature higher than a yield point of the glass, the glass contacting the first mold;
heating the substrate mounting the light-emitting element and held by a second mold by a thermal conduction from the second mold, the first mold and the second mold being separated from each other when heated; and
pressing the glass against the light-emitting element mounted on the substrate supported by the second mold while heating the glass to the temperature higher than the yield point of the glass to seal the light-emitting element with the glass, wherein the glass is heated off and opposite the substrate while being held by the first mold before the pressing of the glass, wherein a bottom surface of an upper one of the first mold and the second mold is provided with a locking portion for holding the substrate or the glass, and wherein the locking portion includes a first locking claw and a second locking claw which extend along two opposite sides of the substrate so as to hold the edges of the two sides of the substrate.

2. The method according to claim 1, wherein a temperature of the second mold in the pressing of the glass is lower than a temperature of the first mold.

3. The method according to claim 1, wherein the first mold is disposed under the second mold.

4. The method according to claim 1, wherein the first mold comprises a protrusion formed on a surface thereof for restricting the pressed glass from flowing out.

5. The method according to claim 4, wherein the glass is plate-shaped, and the protrusion is, in a bottom view of the first mold, shaped like a rectangular frame having a width complementary to the plate-shaped glass.

6. The method according to claim 5, wherein, before pressing the glass, the glass is disposed on a top surface of the protrusion.

7. The method according to claim 5, wherein the protrusion comprises an air vent for venting air outside the rectangular frame.

8. The method according to claim 1, wherein the glass is fusion bonded to the substrate.

9. The method according to claim 1, wherein the temperature of the substrate and the light-emitting element have a temperature lower than the glass before the pressing.

10. The method according to claim 1, wherein the glass contacts the light-emitting element during the heating of the glass.

11. The method according to claim 1, wherein the glass contacts with the substrate and the light-emitting element after being heated to the yield point temperature or higher and is then hot-pressed.

* * * * *